United States Patent [19]

Bochtler

[11] Patent Number: 5,539,617
[45] Date of Patent: Jul. 23, 1996

[54] LIQUID-COOLANT COOLING ELEMENT

[75] Inventor: Alfred Bochtler, Wachenroth, Germany

[73] Assignee: Siemens Aktiengesellschaft, München, Germany

[21] Appl. No.: 406,844

[22] PCT Filed: Sep. 9, 1993

[86] PCT No.: PCT/DE93/00833

§ 371 Date: Mar. 22, 1995

§ 102(e) Date: Mar. 22, 1995

[87] PCT Pub. No.: WO94/07265

PCT Pub. Date: Mar. 31, 1994

[30] Foreign Application Priority Data

Sep. 22, 1992 [DE] Germany .................. 92 12 752 U

[51] Int. Cl.⁶ ........................................... H05H 7/20
[52] U.S. Cl. ................. 361/699; 165/80.4; 257/714
[58] Field of Search .................. 165/80.2, 80.4; 257/714–716; 361/689, 698–699, 701–704, 707, 714, 715, 717–718

[56] References Cited

U.S. PATENT DOCUMENTS

| | | |
|---|---|---|
| 3,361,195 | 1/1968 | Meyerhoff et al. ............... 361/699 |
| 4,183,042 | 1/1980 | Novak et al. ..................... 257/714 |
| 5,088,006 | 2/1992 | del Puerto et al. ............... 361/699 |

*Primary Examiner*—Gregory D. Thompson
*Attorney, Agent, or Firm*—Kenyon & Kenyon

[57] ABSTRACT

A liquid-coolant cooling element for cooling heat-generating disk-shaped components includes a main body which is provided with at least one cooling plate. The cooling plate has a cooling channel led in a double spiral, the ends of which channel open respectively into a collecting chamber. The main body has at least one inlet channel and one outlet channel which respectively open into a passage bore, and are respectively connected in terms of flow to a collecting chamber of at least one cooling plate. Thus, a plurality of power semiconductor components of different contact surfaces can be cooled at a high packing density using the liquid-coolant cooling element.

15 Claims, 3 Drawing Sheets

LIQUID-COOLANT COOLING ELEMENT

BACKGROUND OF THE INVENTION

The present invention relates to a liquid-coolant cooling element for cooling heat-generating disk-shaped components.

Liquid-coolant cooling elements are known for cooling power semiconductor components. The increase in the switching power of semiconductor components is coupled with the generation of a higher heat loss. In general, liquid-coolant cooling elements have a larger cooling power and more easily resist the shock and transition conditions, since their thermal inertia enables short thermal pulses to be equalized with only a slight increase in temperature. The cooling elements are constructed in many cases as cylindrical or cuboid elements with supply and discharge connecting pieces. In the interior of the cooling element a system of channels is constructed which are either parallel or otherwise connected to each other. In some cases, the distribution of the cooling liquid is carried out using constructed partitions. Alternatively, various erections of pins are placed in the path of the liquid flow. All these arrangements are used for increasing the contact surface which transmits the heat to the cooling liquid.

German Patent Document No. DE-A-16 39 047 discloses a cooling element arrangement for semiconductor components which comprises a cooling element, a reversing piece and an end piece. The cooling element and the reversing piece are provided with channels. These cooling and reversing channels preferably have the same shape and dimensions and are offset with respect to each other in such a way that at least two adjacently located cooling channels are connected to each other by a reversing channel. This reversing piece can comprise metal or plastic. Apart from the reversing channels, it contains outflow channels located on the periphery and a centrally located inflow channel. This reversing piece is included in the end piece and is fastened with the latter to the surface of the cooling element facing away from the semiconductor body. The end piece contains a circular ring-shaped collecting channel which is arranged such that all the outflow channels of the reversing piece open into it. Furthermore, this collecting channel is connected to an outlet. An inlet in the end piece is located opposite the opening of the inflow channel of the reversing piece. Because of this configuration of the cooling element arrangement, the coolant runs between the inlet and outlet underneath the surface to be cooled of the semiconductor body, in serpentine fashion. The reversing piece and the end piece can also form one constructional unit.

If the cooling element arrangement comprises a plurality of parts, the contact surfaces between the latter parts must be machined such that a tight seal results, or corresponding seals must be laid between them. Furthermore, the expenditure for producing this cooling element arrangement is very large, since the cooling channels in the cooling element and the reversing channels in the reversing piece must be constructed very accurately in order that the opening of each reversing channel is located directly opposite parts of the opening of at least two cooling channels in the assembled condition.

A cooling can is disclosed in German Patent Document No. DE-A-19 14 790 which is composed of an essentially rectangular connection plate and two cooling pots arranged around the connection plate. The cooling pots have relatively wide and thick collars at the periphery, which are used for the screw connection to the connection plate. That part of the connection plate projecting beyond the cooling pots is simultaneously used as a current connection. The cooling pots contain on the inside a liquid distributor in the form of a plurality of webs which are connected to a central passage and an eccentric passage, with the result that an asymmetrical liquid flow with a relatively large pressure drop prevails in the interior of the cooling pots. A relatively large thermal resistance is produced by this reduction of the pressure drop. The thermal resistance states how much heat can be led away from the disk-shaped semiconductor cell to the coolant. In addition, the heat exchange surface is limited by the constructional shape of the cooling pots. The heat exchange surface is defined as that part of the surface of the cooling pots which is directly swept over by the cooling liquid.

A cooling can is disclosed in German Patent Document No. DE-B-21 60 302 which comprises two round cooling pots, with their two flat heat transfer surfaces resting on the wafer cells, and a plate-shaped connection piece, for cooling liquid and current connections, located between said cooling pots and connected to them in a sealing fashion. The connection piece has inlet and outlet channels directed inward from the edge and each opening into a passage opening which is approximately at right angles to them and penetrates the connection piece. The cooling liquid passes via the inlet channel, the first passage opening, cooling pots and the second passage opening to the output channel. The connection piece is a circular plate having radially aligned inlet and outlet channels flush on the same side and passage bores arranged symmetrically with respect to the center of the connection piece. The cooling pots have, on their side facing the connection piece, uninterrupted concentric annular channels, the partitions of which reach as far as the ends of the connection piece and each of which is connected in terms of flow to the passage bores.

This construction of the cooling pots allows a simple production of these parts as turned parts in automatic turning machines. By means of the use of concentric and uninterrupted annular channels for guiding the cooling liquid, all mutually parallel annular channels being fed simultaneously with cooling liquid from the inlet channel via the passage bore, a very low thermal resistance of the cooling can is achieved. Furthermore, the guiding of coolant in mutually concentric annular channels enables the utilization of the entire surface of the cooling can as a heat exchange surface.

If more than two disk-shaped components have to be cooled, further cooling cans are needed, which are linked together with these disk-shaped components to form a clamped assembly. In consequence, additional liquid connections are necessary. Furthermore, in each case only disk-shaped components having the same diameter can be arranged in one common clamped assembly. Furthermore, a clamped assembly of this type needs sufficient space, a high packing density not being achieved.

SUMMARY OF THE INVENTION

The present invention is based on specifying a liquid-coolant cooling element for cooling heat-generating disk-shaped components, which allows a plurality of power semiconductor components of this type having any diameters to be cooled, at a high packing density.

This is achieved according to the present invention in that the liquid-coolant cooling element comprises a main body which is provided with at least one cooling plate, which has a cooling channel led in a double spiral, the ends of which channel respectively open into a collecting chamber. The main body has at least one inlet and outlet channel, which open respectively into a passage bore, which are respectively connected in terms of flow to a collecting chamber of at least one cooling plate.

By means of this configuration of the liquid-coolant cooling element according to the present invention, in the case of a cube-shaped main body (smallest constructional unit), a maximum of six disk-shaped power semiconductor components of different diameters can be cooled. A liquid-coolant cooling element of this type requires much less space in comparison with a clamped assembly having six disk-shaped power semiconductor components. In addition, further circuit components of the power semiconductor components can be directly arranged around the liquid-coolant cooling element. A compact construction, for example of a converter valve of a high-power converter, is thus achieved. The packing density which is achieved by means of the liquid-coolant cooling element according to the present invention is very high.

In an advantageous refinement of the liquid-coolant cooling element, the cooling plates are respectively arranged in a corresponding recess of the main body. In consequence, only one centering device is needed, by which means the assembly is very much simplified.

In a further advantageous refinement of the liquid-coolant cooling element, the cooling channels of the cooling plates are connected in series and/or in parallel in terms of flow. In consequence, the number of liquid connections is considerably reduced.

Further refinement features include the cooling plate being produced as a turned part and machined, the cooling plate being produced as a casting and machined, the inlet and outlet channel and the passage bore being arranged at approximately right angles to one another, and the cooling plate and the main body being provided with a centering device.

BRIEF DESCRIPTION OF THE DRAWINGS

To explain the present invention in further detail, reference is made to the drawings, in which several exemplary embodiments of the liquid-coolant cooling element according to the present invention are schematically illustrated.

DETAILED DESCRIPTION

Figure 1:
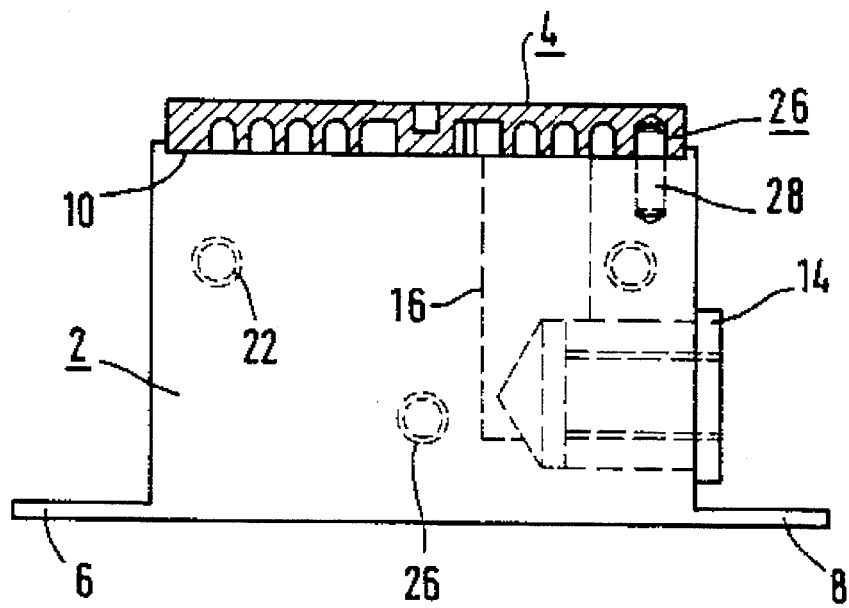
FIG. 1 illustrates a cross section through a first exemplary embodiment of the liquid-coolant cooling element.

FIG. 1 illustrates a cross section through a liquid-coolant cooling element according to an embodiment of the present invention for cooling heat-generating disk-shaped components. The liquid-coolant cooling element comprises a main body 2 and at least one cooling plate 4.

Figure 2:
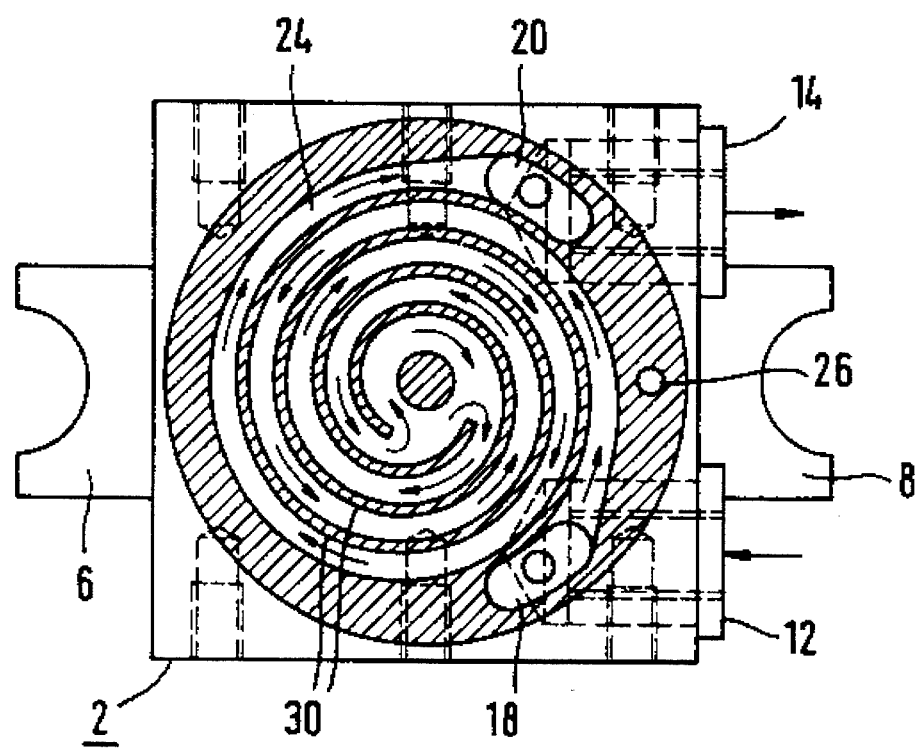
FIG. 2 illustrates an associated top view of the liquid-coolant cooling element according to FIG. 1.

The main body 2 is cube-shaped in the embodiment of FIG. 1 and is provided with two fastening flanges 6 and 8. Metal or plastic can be provided as material for the main body 2. The main body 2 has, for each cooling plate 4, a corresponding recess 10 for holding the cooling plate 4. The main body 2 further contains an inlet and outlet channel 12 and 14 (of which only the outlet channel 14 is seen in the representation illustrated in FIG. 1) and passage bores 16. The passage bores 16 are arranged in the main body 2 in such a way that they connect the inlet and outlet channel 12 and 14 to a collecting chamber 18 and 20 of the cooling plate 4 (FIG. 2). In addition, the main body 2 has further additional threaded bores 22 which serve for purposes of fastening. The inlet or outlet channel 12 or 14, which opens into a passage bore 16, is provided with an internal thread so that a connection of a coolant hose can be detachably connected to the inlet or outlet channel 12 or 14. The inlet or outlet channel 12 or 14 and the associated passage bore 16 are arranged approximately at right angles to one another in the main body.

The cooling plate 4, which is arranged in the corresponding recess 10 of the main body 2, contains a cooling channel 24 led in a double spiral, according to FIG. 2, which shows a top view of the liquid-coolant cooling element in accordance with FIG. 1, the cooling plate 4 being cut open. The ends of cooling channel 24, led in a double spiral, open in each case into a collecting chamber 18 and 20, which are respectively connected in terms of flow to a passage bore 16 of the main body 2. A material of good thermal conduction, for example aluminum or copper, is provided as material for the cooling plate 4. The cooling channel 24, led in a double spiral, can, for example, be milled into the cooling plate 4. In order that each collecting chamber 18 and 20 is connected in terms of flow to a passage bore 16, the cooling plate 4 is provided with a centering device 26. This centering device 26 comprises in each case a bore in the cooling plate 4 and in the main body 2 and a pin 28 (FIG. 1), which sticks up to halfway in these bores. Since the cooling plate 4 is arranged in a corresponding recess 10 of the main body, the cooling plate 4 and the main body 2 can be unequivocally assigned to each other by means of a centering pin 28. Since the cooling plate 4 is constructed so simply, this construction allows a simple production as a turned part in an automatic turning machine. Further processing takes place in boring mills, by means of which the main body 2 is also produced. In addition, the possibility exists of producing the cooling plate 4 as a casting.

The cooling plate 4 is connected to the main body 2 in a suitable manner (e.g., soldering, welding, bonding, cold forming, etc.).

The course of the coolant is indicated in FIG. 2 by means of arrows. In this case, the supplied coolant flows through the inlet channel 12 and the associated passage bore 16 through the main body 2 to a first collecting chamber 18 of the cooling plate 4. From there, the coolant flows through the cooling channel 24, led in a double spiral, to the second collecting chamber 20, by means of which the partitions 30 of this cooling channel 24 are flowed around in opposite directions. From the second collecting chamber 20, the cooling liquid flows through the associated passage bore 16 and the outlet channel 14 out of the main body 2 of this liquid-coolant cooling element.

Figure 3:
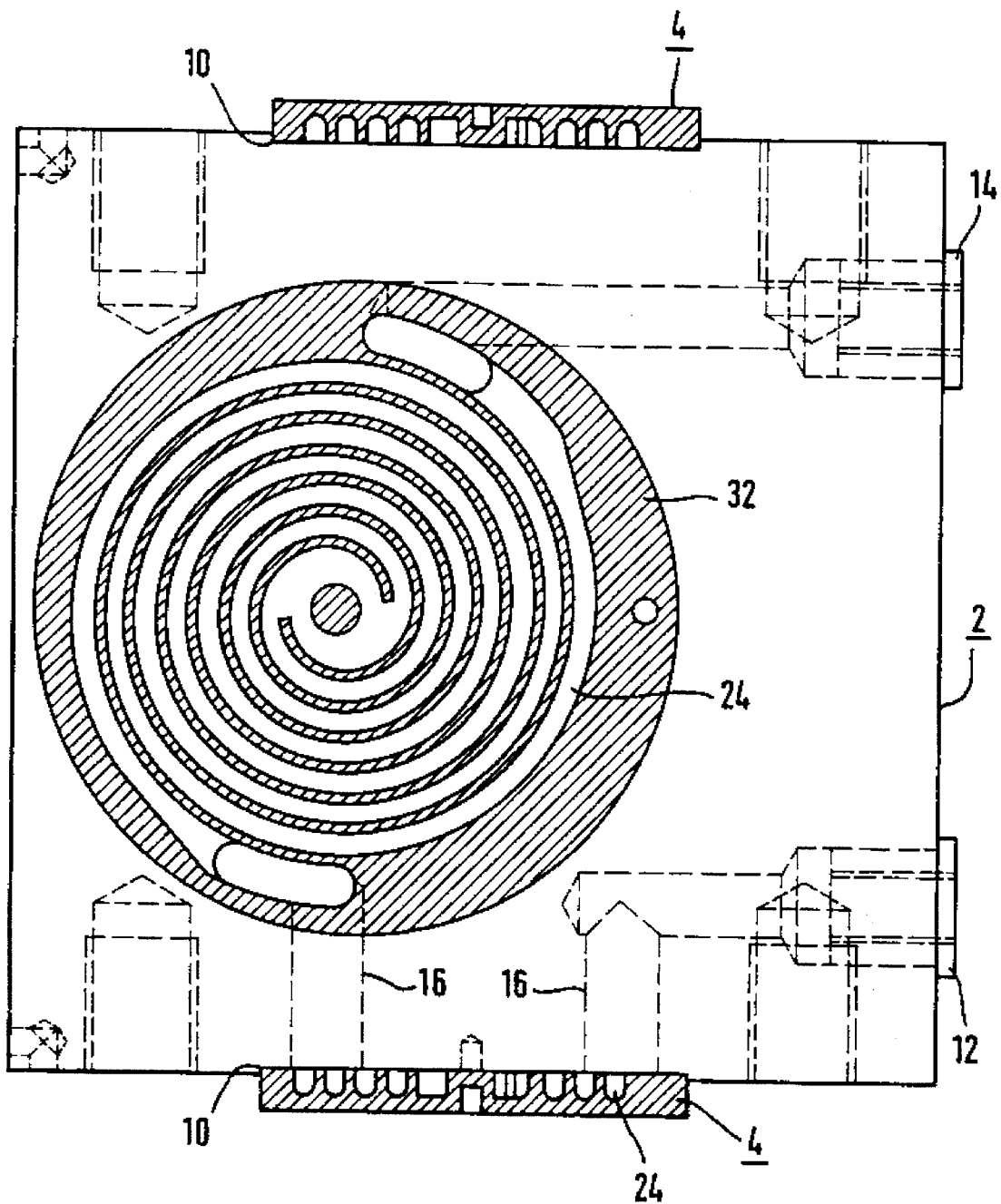
FIG. 3 illustrates a second embodiment of the liquid-coolant cooling element.

FIG. 3 illustrates a second embodiment of the liquid-coolant cooling element according to the present invention, which has four cooling plates 4 and 32 instead of one cooling plate 4 as in the embodiment of FIGS. 1 and 2. In this arrangement, the diameter of the cooling plate 32 is essentially larger than the diameter of the cooling plate 4. Two of the two cooling plates 4 and 32 are present in each case, being arranged on opposite sides of the main body 2 in corresponding recesses 10. In this representation, a top view is shown of the liquid-coolant cooling element, the cooling plate 32 being cut open. In this embodiment, the cooling channels 24, led in a double spiral, of two cooling plates 4 and 32 are in each case connected in series in terms of flow. For this purpose, a first inlet channel 12 is connected in terms of flow via a passage bore 16 to a collecting chamber 18 or 20 of one cooling plate 4. The second collecting chamber 20 or 18 of this cooling plate 4 is connected in terms of flow via two further passage bores 16 to a collecting chamber 18 or 20 of the one cooling plate 32, the second collecting chamber 20 or 18 thereof being connected in terms of flow via a further passage bore to a first outlet channel 14. In exactly the same way, the two other cooling plates 4 and 32 are connected to each other in terms of flow using a second inlet and outlet channel. By means of the configuration of the liquid-coolant cooling element according to the present invention, a plurality of power semiconductor components of different diameters can be cooled at a high packing density, the liquid-coolant cooling element being designed in a space-saving manner.

Figure 4:
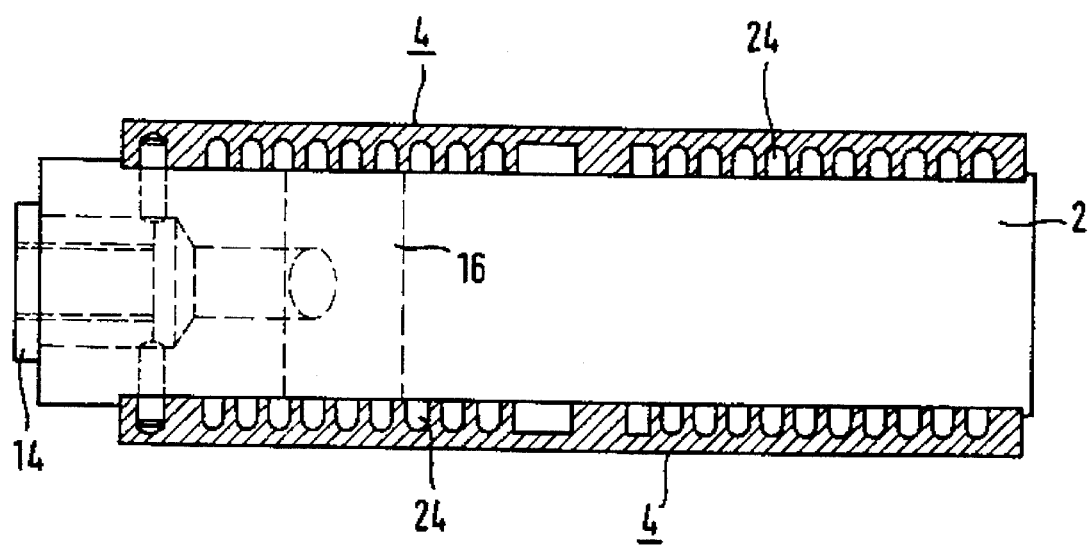
FIG. 4 illustrates a third embodiment of the liquid-coolant cooling element.

FIG. 4 illustrates a cross section through a third embodiment of the liquid-coolant cooling element according to the present invention. This embodiment comprises a main body 2 having two large cooling plates 4 which are arranged opposite each other. The cooling channels 24, led in a double spiral, of the cooling plates 4 are connected in parallel in terms of flow. For this purpose, the inlet channel 12 opens into a passage bore 16, which is in each case connected in terms of flow to a collecting chamber 18 or 20 of the two cooling plates 4. Likewise, the outlet channel 14 opens into a passage bore 16, which is respectively connected in terms of flow to a collecting chamber 20 or 18 of the two cooling plates 4.

Depending on the cooling power, the size of the contact surfaces of the disk-shaped power semiconductor components to be cooled, such as diodes, transistors, thyristors, disconnectable thyristors, . . . , and the waste heat generated by these components, the number of cooling plates 4 and 32 and their interconnection in terms of flow are selected. Depending on the number of cooling plates 4 and/or 32, the spatial extent of the main body 2 is selected, the use of said liquid-coolant cooling element being likewise considered.

Thus, using the liquid-coolant cooling element according to an embodiment of the present invention, a plurality of power semiconductor components of different contact surfaces can be cooled at a high packing density, the spatial dimensions of such a packed liquid-coolant cooling element being very compact in comparison with a conventional clamped assembly.

What is claimed is:

1. A liquid-coolant cooling element for cooling heat-generating disk-shaped components, comprising:
   a main body provided with a cooling plate, the cooling plate having a cooling channel led in a double spiral, wherein ends of the cooling channel respectively open into collecting chambers,
   wherein the main body has one inlet channel and one outlet channel, wherein the inlet channel opens into a first passage bore and the outlet channel opens into a second passage bore, and wherein the first and second passage bores are respectively connected in terms of flow to collecting chambers of the cooling plate.

2. The liquid-coolant cooling element as claimed in claim 1, wherein the cooling plate is arranged in a recess of the main body.

3. The liquid-coolant cooling element as claimed in claim 1, wherein the cooling plate having the cooling channel led in a double spiral is a machined part.

4. The liquid-coolant cooling element as claimed in claim 1, wherein the cooling plate having the cooling channel led in a double spiral is a casted and machined part.

5. The liquid-coolant cooling element as claimed in claim 1, wherein the inlet channel and the outlet channel are arranged at approximately right angles with the first passage bore and the second passage bore, respectively.

6. The liquid-coolant cooling element as claimed in claim 1, wherein the cooling plate and the main body are provided with a centering device.

7. A liquid-coolant cooling element for cooling heat-generating disk-shaped components, comprising:
   a main body provided with a plurality of cooling plates, each of the plurality of cooling plates having a cooling channel led in a double spiral, wherein ends of the cooling channels respectively open into collecting chambers,
   wherein the main body has a plurality of inlet channels and a plurality of outlet channels, wherein the inlet channels each open into a respective passage bore and the outlet channels each open into a respective passage bore, and wherein the passage bores are respectively connected in terms of flow to the collecting chambers of at least one of the plurality of cooling plates.

8. The liquid-coolant cooling element as claimed in claim 7, wherein each of the plurality of cooling plates is respectively arranged in a corresponding recess of the main body.

9. The liquid-coolant cooling element as claimed in claim 7, wherein the cooling channels of the cooling plates are connected in series in terms of flow.

10. The liquid-coolant cooling element as claimed in claim 7, wherein the cooling channels of the cooling plates are connected in parallel in terms of flow.

11. The liquid-coolant cooling element as claimed in claim 7, wherein each of the cooling plates having the cooling channel led in a double spiral is a machined part.

12. The liquid-coolant cooling element as claimed in claim 1, wherein each of the cooling plates having the cooling channel led in a double spiral is a casted and machined part.

13. The liquid-coolant cooling element as claimed in claim 7, wherein the inlet channels and the outlet channels are arranged at approximately right angles with their respective passage bores.

14. The liquid-coolant cooling element as claimed in claim 7, wherein at least one of the plurality of cooling plates is provided with a centering device.

15. The liquid-coolant cooling element as claimed in claim 7, wherein the main body is provided with a centering device.

* * * * *